United States Patent
Lee

(10) Patent No.: US 8,414,117 B2
(45) Date of Patent: Apr. 9, 2013

(54) INK JET PRINTING APPARATUS

(75) Inventor: Hee-Young Lee, Gunsan (KR)

(73) Assignee: Medikan Co., Ltd., Seoul (KR)

( * ) Notice: Subject to any disclaimer, the term of this patent is extended or adjusted under 35 U.S.C. 154(b) by 0 days.

(21) Appl. No.: 12/597,911

(22) PCT Filed: Apr. 27, 2007

(86) PCT No.: PCT/KR2007/002099
§ 371 (c)(1),
(2), (4) Date: Oct. 27, 2009

(87) PCT Pub. No.: WO2008/133361
PCT Pub. Date: Nov. 6, 2008

(65) Prior Publication Data
US 2010/0091078 A1    Apr. 15, 2010

(51) Int. Cl.
| | |
|---|---|
| *B41J 2/01* | (2006.01) |
| *B41J 29/38* | (2006.01) |
| *B41J 2/205* | (2006.01) |
| *B41J 2/06* | (2006.01) |
| *B41J 2/05* | (2006.01) |
| *B41J 2/045* | (2006.01) |

(52) U.S. Cl.
USPC ............... 347/102; 347/10; 347/15; 347/55; 347/67; 347/71

(58) Field of Classification Search ................ None
See application file for complete search history.

(56) References Cited

U.S. PATENT DOCUMENTS

| | | | |
|---|---|---|---|
| 6,457,807 B1 | 10/2002 | Hawkins et al. | |
| 2004/0179079 A1* | 9/2004 | Yokoyama | 347/102 |
| 2004/0189750 A1* | 9/2004 | Miura et al. | 347/52 |
| 2005/0078138 A1* | 4/2005 | Koyama | 347/19 |
| 2006/0012058 A1 | 1/2006 | Hasei | |

FOREIGN PATENT DOCUMENTS

JP     2006-247622     9/2006

OTHER PUBLICATIONS

International Search Report and Written Opinion for International Application No. PCT/KR2007/002099, mailed Jan. 14, 2008.

* cited by examiner

*Primary Examiner* — Stephen Meier
*Assistant Examiner* — Alexander C Witkowski
(74) *Attorney, Agent, or Firm* — Nixon Peabody LLP

(57) ABSTRACT

According to the present invention, the size of a droplet ejected to a target area is minimized to obtain high printing resolution, and effects of attraction and adhesive forces acting between a nozzle and air resistance can be minimized so that the target area is finely controlled to obtain high printing precision. An inkjet printing apparatus according to the present invention includes an ejecting device ejecting a droplet of a solution to a target area; and a light irradiating device irradiating light onto the droplet at an acute angle with respect to a line going through the ejecting device and the target area to heat and evaporate a part of the droplet before the ejected droplet reaches the target area, so that the droplet is accelerated along the line.

6 Claims, 8 Drawing Sheets

INK JET PRINTING APPARATUS

CROSS REFERENCE TO RELATED APPLICATIONS

This application is a national phase of International Application No. PCT/KR2007/002099 entitled "Ink Jet Printing Apparatus", which was filed on Apr. 27, 2007.

TECHNICAL FIELD

The present invention relates to an inkjet printing apparatus, and more particularly, to an inkjet printing apparatus in which a droplet to be ejected from a nozzle has a sufficiently large size so that the droplet can be easily ejected, and after the droplet is ejected from the nozzle, light is irradiated onto the droplet to heat and partially evaporate the droplet so as to reduce the size of the droplet and increase the kinetic energy of the droplet in the ejection direction.

The present invention relates to inkjet printing which enables easy formation of fine patterns at low costs. Generally, inkjet printing is better than photolithography typically including exposing and etching processes.

As the development rate of electronic technologies is increasing, fine micro structure forming techniques are becoming more important in various fields related to printed circuit boards, display panels, biochips, scaffolds for culturing cells, etc.

Conventionally, microstructures, such as metal patterns, insulating layers, or separation layers, are usually made through photolithography including exposing and etching processes. However, photolithography is complex and expensive, and contaminates the environment. Accordingly, there is a need to develop a new technique.

BACKGROUND ART

Inkjet printing is a non-contact printing technique that is simple, inexpensive, and environmentally friendly. Due to these advantages, inkjet printing is used to print fine patterns required in various smaller and thinner apparatuses. For example, inkjet printing can be used in a process of manufacturing second-dimension planar structures, such as a process of interconnecting various electronic circuits and display substrates, or a process of manufacturing biochips, and furthermore, in a process of manufacturing three-dimensional steric structures, such as a process of manufacturing scaffolds for culturing cells in biotechnology.

In inkjet printing, the size of a droplet should be small to improve fineness, that is, the resolution of patterns printed using an inkjet printing apparatus. In general, the resolution of an inkjet printing apparatus is dependent on the size of a droplet and a spread area of a droplet in a target area, that is, an area to be printed. That is, as the size of a droplet ejected from a nozzle is smaller, the resolution is improved. Therefore, research for decreasing the size of a droplet is being actively performed.

In a conventional inkjet printing apparatus, the size of a droplet is reduced before the droplet is ejected through a nozzle. This method, however, causes many technical problems.

First, when the size of a droplet is too small, the droplet has a small cohesion volume, and thus, when ejected, the droplet can be broken into two or three droplets.

Secondly, a droplet is relatively more affected by a surface tension than by an attraction force between molecules in the droplet, which induces a cohesion force of the droplet. Accordingly, the relative attraction and adhesive forces acting between the droplet and the surface of a nozzle increase, and thus when the droplet is ejected from the nozzle, the ejection directions of the droplet become non-uniform. Therefore, the droplet is non-uniformly printed in a target area, and thus, a degree of fineness is decreased.

Thirdly, when the size of a droplet is decreased, the inertial mass of the droplet is decreased, and thus, the kinetic energy related to the inertia of the droplet is decreased. When the kinetic energy of the droplet is decreased due to the decrease in the size of the droplet, the attraction and adhesive forces acting between the nozzle and the droplet are increased and the droplet is affected more by the resistance and flow of the air when the droplet drops. Therefore, the droplet is non-uniformly printed in a target area, and thus, a degree of fineness is decreased.

Accordingly, there have been many attempts to increase the kinetic energy of a droplet so that the droplet can be precisely ejected to a target area independently from external forces, such as air resistance, while the size of the droplet is minimized. For example, a droplet can be accelerated in a nozzle before being ejected. This technique, however, necessarily requires an acceleration area in the nozzle to accelerate the droplet, which causes clogging of the nozzle since the nozzle should be formed in a fine structure to eject a fine droplet.

DETAILED DESCRIPTION OF THE INVENTION

Technical Problem

Figure 1A:
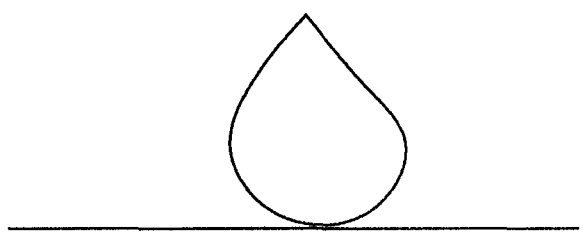
FIGS. 1A and 1B are schematic views illustrating a printed state in view of the viscosity of a droplet in an inkjet printing apparatus according to an embodiment of the present invention.

The present invention provides an inkjet printing apparatus having high printing resolution.

In the inkjet printing apparatus, the size of a droplet printed in a target area is minimized so that high printing resolution can be obtained, and the attraction and adhesive forces acting between a nozzle and the droplet or air resistance are small so that a target area to be printed by the droplet can be precisely control and thus high to printing precision can be obtained.

In the inkjet printing apparatus, the size of the droplet ejected from a nozzle is a sufficiently large so that clogging of the nozzle and non-uniformity of an ejection direction of the droplet can be prevented.

In the inkjet printing apparatus, the size of the droplet ejected from the nozzle is reduced and a kinetic energy of the droplet in the ejection direction is increased, so that high printing precision can be obtained.

Technical Solution

The present invention provides an inkjet printing apparatus in which a droplet ejected from the nozzle can be formed in a sufficiently large size so that the droplet can be easily ejected, and after the droplet is ejected from the nozzle, light is irradiated onto the droplet to heat and partially evaporate the droplet so that the size of the droplet is reduced and the kinetic energy of the droplet can be increased in the ejection direction.

According to an aspect of the present invention, there is provided an inkjet printing apparatus including: an ejecting device ejecting a droplet of a solution to a target area of a subject to be printed; and a light irradiating device irradiating light onto the droplet at an acute angle with respect to a line going through the ejecting device and the target area to heat and partially evaporate the droplet before the ejected droplet reaches the target area, so that the droplet is accelerated along the line.

The light may be irradiated onto a surface of a top portion of the droplet opposite to an ejection direction of the droplet so that gas generated when partially evaporating the droplet is formed in the opposite direction to the ejection direction.

The light irradiating device may include at least two light sources irradiating light in different directions.

The light sources may be symmetrically disposed with respect to the droplet on a surface perpendicular to the line so as to prevent a change in the ejection direction toward a direction perpendicular to the ejection direction of the droplet due to the partial evaporation of the droplet.

The light sources may be separated form each other at an equal angular distance around the droplet direction on a surface perpendicular to the line.

The light irradiating device may include an optical member disposed between the to light source and the ejecting device to guide light irradiated from the light sources to the droplet ejected from the ejecting device.

According to another aspect of the present invention, there is provided an inkjet printing apparatus including: a nozzle ejecting a droplet of a solution to a target area separated from the nozzle at a predetermined distance; and a light irradiating device irradiating light onto the droplet at an acute angle with respect to an ejection direction of the droplet before the droplet ejected from the nozzle reaches the target area to partially evaporate the droplet.

The light sources may be separated from each other and each form equal angles with respect to the droplet direction on a surface perpendicular to the ejection direction of the droplet.

Advantageous Effects

In an inkjet printing apparatus according to an embodiment of the present invention, a droplet ejected from a nozzle has a sufficiently large size so that the effect of the attraction and adhesive forces acting between the nozzle and the droplet is minimized and thus, the droplet can be easily ejected from the nozzle and clogging of the nozzle can be prevented.

In addition, in the inkjet printing apparatus, after the droplet is ejected from the nozzle, light is irradiated on the droplet, and the droplet is heated and partially evaporated. Therefore, the size of the droplet is reduced, so that the resolution of the inkjet printing apparatus is improved.

Furthermore, in the inkjet printing apparatus, a light irradiating device irradiates light onto the surface of a top portion of a droplet at an acute angle with respect to an ejection direction of the droplet, and thus, the droplet is accelerated due to the action and counter action effect of a gas evaporated from the droplet and air resistance acting on the droplet can be decreased. As a result, even when the size of the droplet is reduced due to the light irradiation onto the droplet, high printing resolution can be obtained.

BEST MODE OFF CARRYING OUT THE INVENTION

The present invention will now be described more fully with reference to the accompanying drawings, in which exemplary embodiments of the invention are shown.

Figure 1B:
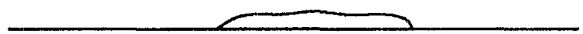

FIGS. 1A and 1B are schematic views illustrating a printed state in view of the viscosity of a droplet in an inkjet printing apparatus according to an embodiment of the present invention.

When the size of a droplet ejected from a nozzle is reduced to improve the printing resolution, a target area is non-uniformly printed by the droplet due to, for example, air resistance or an adhesive force between an end of the nozzle and the droplet. Such non-uniformity may be caused by a decrease in the kinetic energy of the droplet resulting from a decrease in an inertial mass of the droplet. Such problems can be addressed by increasing the density and mass of a droplet solution while maintaining the size of the droplet ejected to be small.

However, when the density of the solution is increased, the viscosity of the droplet is increased so that the adhesive force of the droplet with respect to the nozzle is relatively increased. As a result, a target area is non-uniformly printed and the nozzle may be easily clogged. In addition, since the droplet is formed in a solid state and thus forms a ligament tail after being printed as illustrated in FIG. 1A, printing precision can be decreased. The viscosity of the droplet should be maintained to a proper level to obtain good printing as illustrated in FIG. 1B.

Unlike a conventional technique in which the size of a droplet is reduced before the droplet is ejected from a nozzle of an ink ejecting device, in the inkjet printing apparatus according to an embodiment of the present invention, after the droplet is ejected, the size of the droplet is reduced by irradiating light onto the droplet to heat and partially evaporate the droplet so as to reduce the size of the droplet.

However, in this case, several problems have to be addressed.

First, an interval between the nozzle and a printing surface is very small. As a result, the droplet should be heated very quickly to heat and partially evaporate droplet ejected from the nozzle by light irradiation. However, when the droplet is quickly heated through light irradiation with high energy, vapor may be generated in a great amount and thus, a vapor pressure is formed, the movement of the droplet may change due to vapor flow, and the droplet may flow back toward the nozzle.

Secondly, in order to prevent such problems due to quick heating, the droplet should be heated gradually. In this case, however, the size of the droplet is insufficiently reduced, and thus, the spread area of the droplet in a target area may be increased and the printing resolution may deteriorate. Although the sufficient decrease in the size of the droplet and gradual heating of the droplet can be achieved at the same time by widening the interval between the nozzle and the printed surface, probability of error in printing the droplet to an exact target area may increase. That is, the kinetic energy of the droplet may be decreased too much so that the droplet ejected from the nozzle cannot move to the exact target area due to, for example, air resistance.

Figure 2:
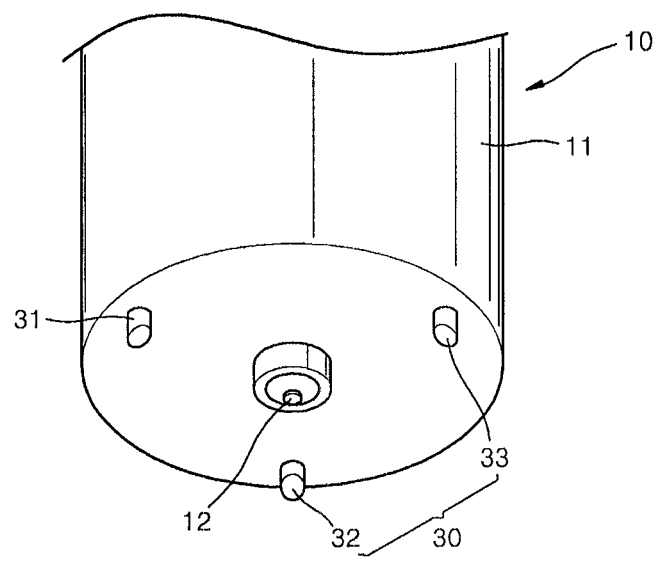
FIG. 2 is a perspective bottom view of an inkjet printing apparatus according to an embodiment of the present invention.
Figure 3:
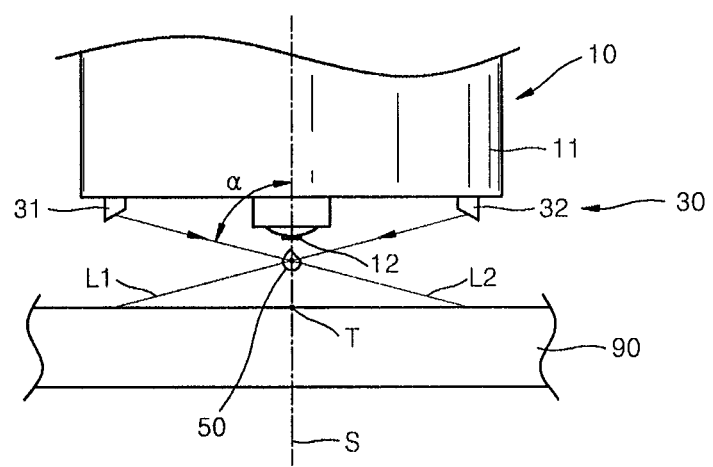
FIG. 3 is a side view of the inkjet printing apparatus illustrated in FIG. 2.

FIG. 2 is a perspective bottom view of an inkjet printing apparatus according to an embodiment of the present invention, and FIG. 3 is a side view of the inkjet printing apparatus illustrated in FIG. 2.

The inkjet printing apparatus of FIG. 2 includes an ejecting device 10 ejecting a droplet 50 of a solution to a target area (T), and a light irradiating device 30 irradiating lights L1 and L2 to heat and evaporate the droplet 50.

In the inkjet printing apparatus, the ejecting device 10 includes a head unit 11 and a nozzle 12 equipped in the head unit 11. The ejecting device 10 ejects the droplet 50 to the target area T of a subject 90 to be printed. If required, a plurality of a nozzle can be used, and the nozzle 12 may have various shapes and types.

The head unit 11 may contain a solution to be ejected in the form of droplets through the nozzle 12. Since the solution should evaporate when heated by light irradiation, the solution may contain a solvent that may evaporate by light irradiation-induced heating. For example, the solution may contain water or an evaporable and volatile solvent. The solution may further include a coloring agent which colors an ink composition and a solvent including the coloring agent.

The light irradiating device 30 irradiates lights L1 and L2 onto the droplet 50 at an acute angle α with respect to a line S going through the nozzle 12 of the ejecting device 10 and the target area T before the droplet 50 ejected from the nozzle 12 reaches the target area T. Thus, the droplet 50 is heated by the energy of the lights L1 and L2 so that a part of the droplet 50 evaporates.

The light irradiating device 30 may include a plurality of light sources which are separated from each other at equal angular distances around the nozzle 12. The light sources irradiate light onto the droplet 50 in different directions. In the current embodiment, the light irradiating device 30 includes a first light source 31, a second light source 32, and a third light source 33. Although the third light source 33 is not illustrated in FIG. 3, the third light source 33 also irradiates a light L3 onto the droplet 50 ejected from the nozzle 12.

In the current embodiment, the light irradiating device 30 includes the first, second, and third light sources 31, 32, and 33. However, the number of light sources is not limited to three. For example, the light irradiating device 30 can include two light sources. When the light irradiating device 30 includes two light sources, the light sources may be disposed symmetrical with respect to an ejection direction of the droplet 50 on a surface perpendicular to the ejection direction of the droplet 50, in order to prevent a change in the ejection direction of the droplet 50 due to evaporation of the droplet 50. That is, the light sources may be symmetric with respect to the droplet 50, forming an angle of 180° between them on a surface perpendicular to the ejection direction of the droplet 50.

The light sources 31, 32, and 33 may be disposed such that the lights L1, L2, and L3 are irradiated to the surface of a top portion of the droplet 50 opposite to the ejection direction along the line S. As a result, a gas generated when the droplet 50 partially evaporates can be formed in the opposite direction to the ejection direction of the droplet 50. In the current embodiment, the light sources 31, 32, and 33 may be disposed such that lights L1, L2, and L3 are focused to a point P.

Figure 4:
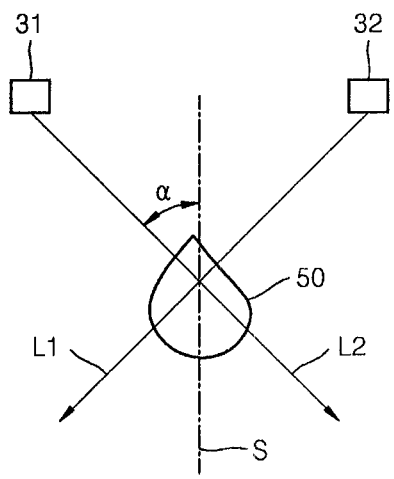
FIG. 4 is a schematic side view illustrating lights irradiated to a droplet in the inkjet printing apparatus illustrated in FIG. 2.
Figure 5:
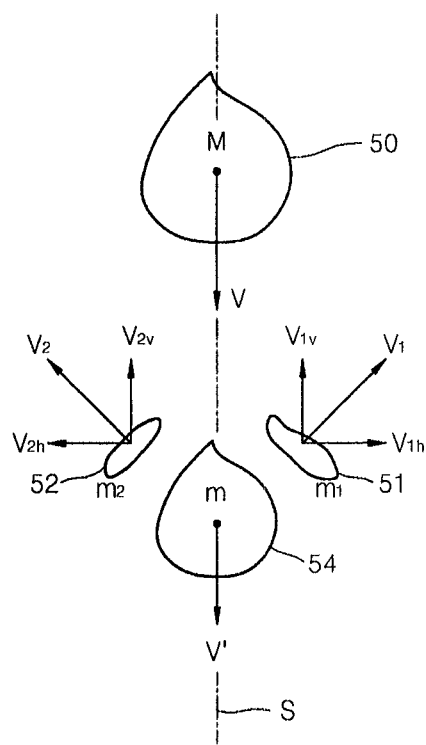
FIG. 5 is a schematic side view illustrating a change in the kinetic state of a droplet after light is irradiated thereon in the inkjet printing apparatus as illustrated in FIG. 4.

FIG. 4 is a schematic side view illustrating lights irradiated to a droplet in the inkjet printing apparatus illustrated in FIG. 2, and FIG. 5 is a schematic side view illustrating a change in the kinetic state of the droplet after light is irradiated onto the droplet in the inkjet printing apparatus as illustrated in FIG. 4.

The line S goes through the nozzle 12 and the target area T. The droplet 50 is ejected from the nozzle 12 along the line S. The first light source 31 and the second light source 32 irradiate the lights L1 and L2 to the surface of a top portion of the droplet 50 opposite to the ejection direction. The third light source 33 (not shown) also irradiates the light L3 in the same direction as described above.

Assuming that light is irradiated to the surface of a bottom portion of the droplet 50, the bottom portion of the droplet 50 may evaporate to obstruct the movement of the droplet 50. With this reason, the lights should be disposed as described above.

The lights L1 and L2 respectively irradiated from the light sources 31 and 32 reach the droplet 50 at an acute angle α with respect to the line S. When light irradiated from a light source reaches a side surface of the droplet 50, that is, when light reaches the droplet 50 at about 90° with respect to the line S, an acceleration effect of the droplet 50 due to an action/reaction effect cannot be obtained, which will be described later.

When the droplet 50 has a first mass M and the droplet 50 is heated and partially evaporated by irradiation of the lights $L_1$ and $L_2$ as illustrated in FIG. 4, the mass of the droplet 50 may be reduced to a second mass m after the evaporation. Referring to FIG. 5, V denotes the velocity of the droplet 50 before evaporation, and V' denotes the velocity of the droplet 50 after evaporation. V' is smaller than V.

In addition, $m_1$ and $m_2$ denote masses of evaporation gases. $V_1$ denotes a velocity of the gas having the mass $m_1$, and $V_2$ denotes a velocity of the gas having the mass $m_2$. $V_1$ has a vertical component $V_{1v}$ parallel to the line S and a horizontal component $V_{1h}$. $V_2$ has a vertical component $V_{2v}$ parallel to the line S and a horizontal component $V_{2h}$. According to the law of conservation of momentum, the momentum should be the same before and after evaporation. As a result, the momentum operating along the line S can be given by Equation 1:

$$M \times V = m \times V' (m_1 \times V_{1v} + m_2 \times V_{2v}) \qquad (1)$$

Accordingly, the velocity V' of a droplet 54 having a reduced size after being heated by light irradiation is greater than V. That is, although the mass of the droplet 54 is smaller than the mass of the droplet 50 after the droplet 50 is partly evaporated by light irradiation-induced heating, the speed of the droplet 54 is greater than the speed of the droplet 50 due to the action/reaction effect of the evaporated gas. Accordingly, according to the current embodiment, a decrease in printing precision due to a decrease in a kinetic energy resulting from a decrease in the size of a droplet can be sufficiently prevented.

Figure 6:
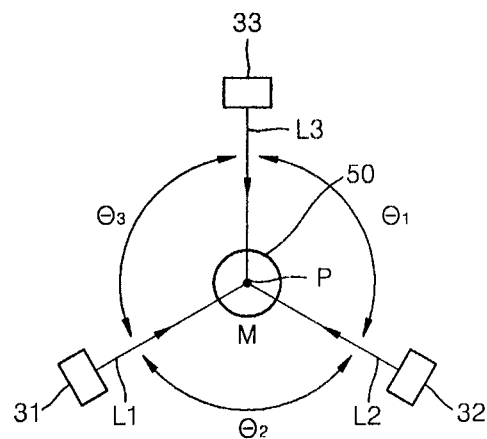
FIG. 6 is a schematic plan view illustrating light irradiated to a droplet in the inkjet printing apparatus illustrated in FIG. 2.
Figure 7:
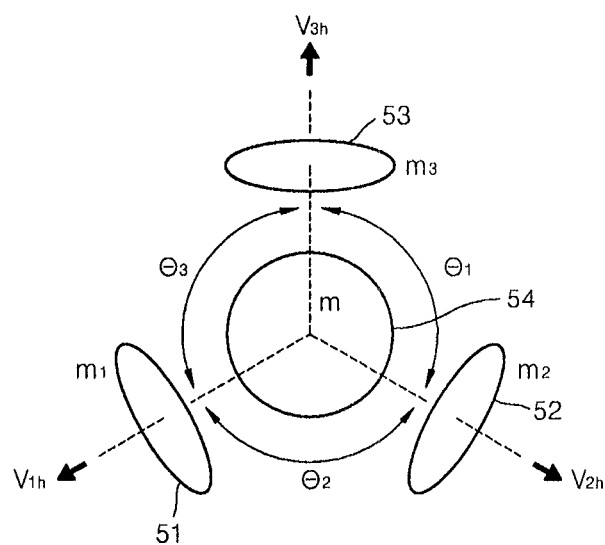
FIG. 7 is a schematic plan view illustrating a change in the kinetic state of a droplet after light is irradiated thereon in the inkjet printing apparatus as illustrated in FIG. 6.

FIG. 6 is a schematic plan view illustrating light irradiation to a droplet in the inkjet printing apparatus illustrated in FIG. 2. FIG. 7 is a schematic plan view illustrating momentum of a droplet after light is irradiated thereon in the inkjet printing apparatus as illustrated in FIG. 6.

When only one light source is used, the ejection direction of the droplet 50 may be changed in a direction transversing the ejection direction, that is, a horizontal direction, due to an action/reaction effect of a gas evaporated from the droplet 50. In the inkjet printing apparatus according to the current embodiment, light sources are symmetrically disposed with respect to a droplet to minimize the action/reaction effect.

To the end, as illustrated in FIG. 6, the first light source 31, the second light source 32, and the third light source 33 may be symmetrically disposed with respect to the droplet 50 on a surface perpendicular to the line S. Accordingly, the lights L1, L2, and L3 respectively irradiated from the light sources 31, 32, and 33 are focused to a point P, and angles θ1, θ2, and θ3 between the lights L1, L2, and L3 disposed around the droplet 50 are equal.

When the light sources 31, 32, and 33 are disposed as illustrated in FIG. 6 and the lights L1, L2, and L3 are irradiated onto the droplet 50 and thereby, the droplet 50 is heated and evaporated, as illustrated in FIG. 7, the size of the droplet 50 may be reduced to form the droplet 54 and gases 51, 52, and 53 are ejected from the droplet 54 to the outside. At this time, the directions in which the gases 51, 52, and 53 move from same angular distances from each other with respect to the droplet 54, and thus the action/reaction effect of the gases 51, 52, 53 on the droplet 54 can offset each other. Accordingly, a change in movement direction of the droplet 54 in a horizontal direction with respect to the ejection direction of the droplet 54 can be minimized, and thus the droplet 54 can be precisely printed.

Figure 8:
FIG. 8 is a pictorial view illustrating an experimental example performed using an inkjet printing apparatus according to an embodiment of the present invention.
Figure 9:
FIG. 9 is a pictorial view illustrating the time when light is irradiated according to the experimental example of FIG. 8.
Figure 10:
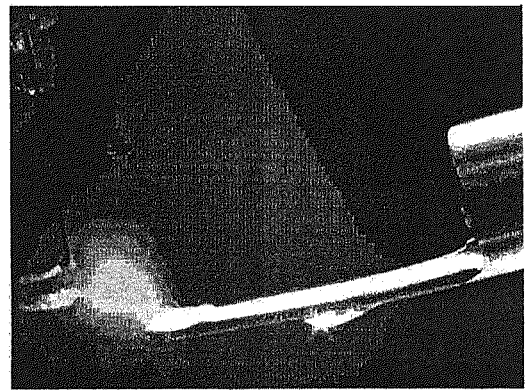
FIG. 10 is a pictorial view illustrating a change in a moving direction of a droplet according to the experimental example of FIG. 8.
Figure 11:
FIG. 11 is a pictorial view illustrating a droplet moving in a changed direction according to the experimental example of FIG. 8.
Figure 12:
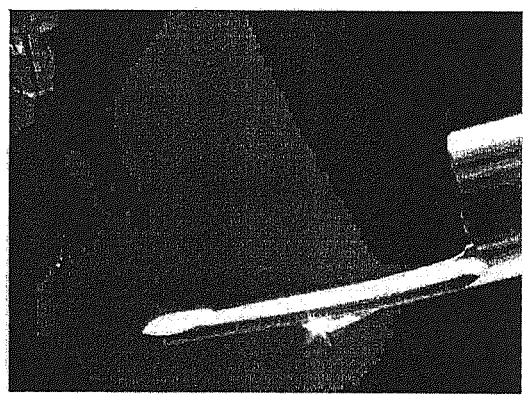
FIG. 12 is a pictorial view illustrating a droplet that has moved according to the experimental example of FIG. 8.

FIG. 8 is a pictorial view illustrating an experimental example performed using an inkjet printing apparatus according to an embodiment of the present invention, FIG. 9 is a pictorial view illustrating the time when light is irradiated according to the experimental example of FIG. 8, FIG. 10 is a pictorial view illustrating a change in the movement direction of a droplet according to the experimental example of FIG. 8, FIG. 11 is a pictorial view illustrating a droplet moving in the changed movement direction according to the experimental example of FIG. 8, and FIG. 12 is a pictorial view illustrating a droplet that has moved according to the experimental example of FIG. 8.

In the experimental example described with reference to FIGS. 8 through 12, light is irradiated onto the droplet in one direction.

When light is irradiated onto a droplet in one direction after the droplet is ejected as illustrated in FIG. 8, a part of the droplet is heated and evaporated as illustrated in FIG. 9. In this case, the evaporated gas moves in the opposite direction to the ejection direction of the droplet due to the action/reaction effect of the evaporated gas as illustrated in FIGS. 10 through 12. Therefore, the movement direction of the droplet is changed.

MODE OF CARRYING OUT THE INVENTION

Figure 13:
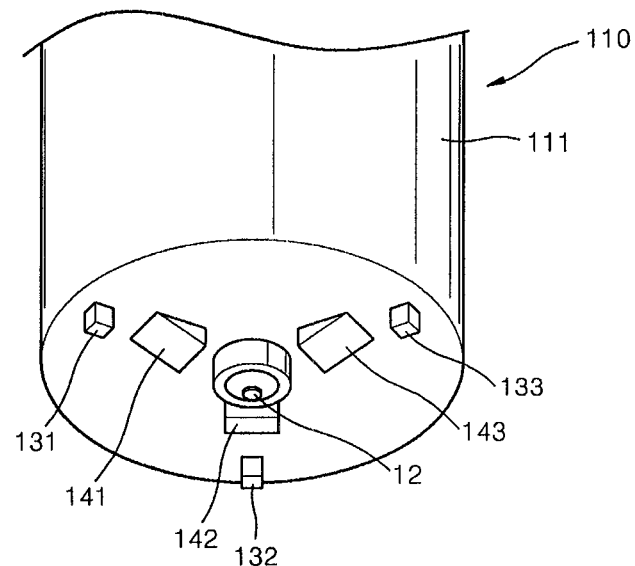
FIG. 13 is a perspective bottom view of an inkjet printing apparatus according to another embodiment of the present invention.
Figure 14:
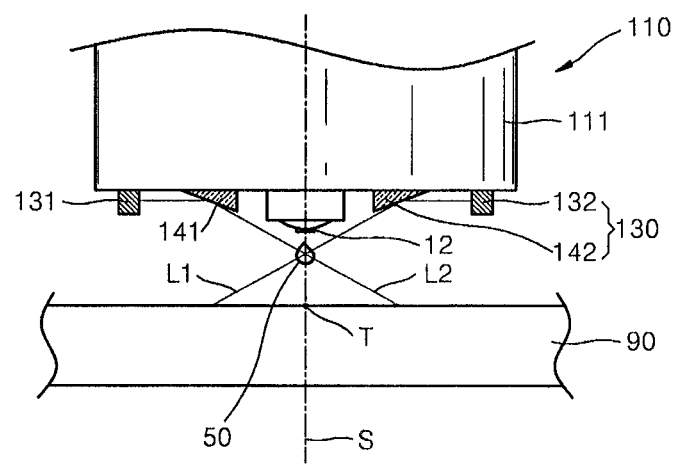
FIG. 14 is a side view of the inkjet printing apparatus of FIG. 13.

FIG. 13 is a perspective bottom view of an inkjet printing apparatus according to another embodiment of the present invention. FIG. 14 is a side view of the inkjet printing apparatus of FIG. 13.

Referring to FIGS. 13 and 14, the inkjet printing apparatus includes an ejecting device 110 which is separated from an object 90 to be printed by a predetermined distance and ejects a droplet 50 to the object 90 to be printed, and a light irradiating device 130 irradiating light onto the droplet 50.

Like in the previous embodiment described with reference to FIG. 2, the ejecting device 110 includes a nozzle 12 ejecting the droplet 50 and a head unit 111.

Like in the previous embodiment described with reference to FIG. 2, the light irradiating device 130 includes light sources 131, 132, and 133 symmetrically disposed with respect to the nozzle 12 and separated each other by the same angular distance. The inkjet printing apparatus according to the current embodiment is different from the inkjet printing apparatus according to the previous embodiment in that the inkjet printing apparatus according to the current embodiment includes optical members 141, 142, and 143 controlling paths of lights L1 and L2 irradiated from the light sources 131 and 132 so that the lights L1 and L2 is directed toward the droplet 50.

The optical members 141, 142, and 143 can be an optical member, such as a mirror, a lens, a prism, an optical filter, or a combination thereof. Since the interval between the nozzle 112 and the object 90 to be printed is too small, it can be difficult to control the light irradiated from the light sources 131, 132, and 133 to be directed to the droplet 50 at an acute angle with respect to the line S. However, by using the optical members 141, 142, and 143, it is possible to easily control the path of light irradiated onto the droplet 50. Therefore, design degrees of freedom are increased, and the inkjet printing apparatus can be easily designed in a small size.

Figure 15:
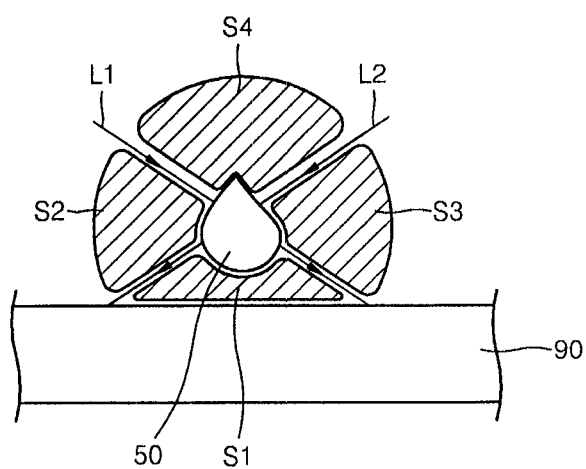
FIG. 15 is a view illustrating areas where pressure is formed by gases evaporated from a droplet in the inkjet printing apparatus of FIG. 13.

FIG. 15 is a view illustrating areas where pressure is formed by gases evaporated from the droplet in the inkjet printing apparatus of FIG. 13.

The lights L1 and L2 may be irradiated to the surface of a top portion of the droplet 50 opposite to the ejection direction of the droplet 50 so that a gas evaporated from a part of the droplet 50 is formed in the opposite direction to the ejection direction of the droplet 50. The term "ejection direction" of the droplet 50 refers to a direction in which the droplet 50 is ejected from a nozzle (not shown) to the object 90 to be printed.

As described in embodiments of the present invention, the droplet 50 is affected by the gas evaporated from the droplet 50 through an action/reaction effect, and thus, the droplet 50 can be accelerated in an opposite direction to a gas evaporation direction. The gas evaporated from the droplet 50 causes the action/reaction effect and can form a pressure affecting the movement of the droplet 50. For example, if the evaporated gas of the droplet 50 occupies an area S1 illustrated in FIG. 15, the gas between the object 90 to be printed and the droplet 50 forms a pressure and the formed pressure can act as a resistance against the movement of the droplet 50 ejected to the object 90 to be printed. Therefore, printing precision may be decreased. According to the present invention, to sufficiently obtain an acceleration effect due to evaporation of a gas, the gas evaporated from the droplet 50 is formed in an opposite direction to the ejection direction of the droplet 50, that is, S2, S3, and S4 areas as illustrated in FIG. 15.

As described above, paths of the lights L1 and L2 should be adjusted in consideration of an area in which the evaporated gas forms a pressure such that the paths of the lights L1 and L2 should not cross an area corresponding to the target area, that is, S1 that is an area corresponding to a bottom portion of the droplet 50.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An inkjet printing apparatus comprising:
an ejecting device ejecting a droplet of a solution to a target area of a subject to be printed; and
a light irradiating device irradiating light onto the droplet at an acute angle with respect to a line going through the ejecting device and the target area to heat and partially evaporate the droplet before the ejected droplet reaches the target area, so that the droplet is accelerated along the line,
wherein the light irradiating device comprises at least two light sources irradiating light in different directions onto the droplet,
wherein the light sources are separated from each other at an equal angular distance around the droplet on a surface perpendicular to the ejection direction of the droplet.

2. The inkjet printing apparatus of claim 1, wherein the light irradiating device irradiates light onto a surface of a top portion of the droplet opposite to an ejection direction of the droplet so that a gas generated by partially evaporating the droplet is formed in the opposite direction to the ejection direction.

3. The inkjet printing apparatus of claim 1, wherein the light sources are symmetrically disposed with respect to the droplet on a surface perpendicular to the line so as to prevent a change in the ejection direction toward a direction perpendicular to the ejection direction of the droplet due to partial evaporation of the droplet.

4. The inkjet printing apparatus of claim 1, wherein the light irradiating device comprises an optical member disposed between the light source and the ejecting device guiding light irradiated from the light sources to the droplet ejected from the ejecting device.

5. An inkjet printing apparatus comprising:
a nozzle ejecting a droplet of a solution to a target area separated from the nozzle by a predetermined distance; and
a light irradiating device irradiating light onto the droplet at an acute angle with respect to an ejection direction of the droplet before the droplet ejected from the nozzle reaches the target area to partially evaporate the droplet,
wherein the light irradiating device comprises at least two light sources irradiating light in different directions onto the droplet,
wherein the light sources are separated from each other at an equal angular distance around the droplet on a surface perpendicular to the ejection direction of the droplet.

6. The inkjet printing apparatus of claim 5, wherein the light is irradiated to a surface of a top portion of the droplet opposite to the ejection direction of the droplet so that a gas generated by partially evaporating the droplet is formed in the opposite direction to the ejection direction of the droplet.

* * * * *

UNITED STATES PATENT AND TRADEMARK OFFICE
CERTIFICATE OF CORRECTION

PATENT NO.       : 8,414,117 B2
APPLICATION NO. : 12/597911
DATED            : April 9, 2013
INVENTOR(S)      : Hee-Young Lee It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 431 days.

Signed and Sealed this
First Day of September, 2015

Michelle K. Lee
*Director of the United States Patent and Trademark Office*